(12) United States Patent
Hsieh et al.

(10) Patent No.: US 11,802,657 B2
(45) Date of Patent: Oct. 31, 2023

(54) DISPLAY DEVICE AND FIXING MODULE

(71) Applicant: Qisda Corporation, Taoyuan (TW)

(72) Inventors: Hsin-Che Hsieh, Taoyuan (TW);
Shih-An Lin, New Taipei (TW);
Kuan-Hsu Lin, New Taipei (TW);
Hsin-Hung Lin, Taoyuan (TW);
Yung-Chun Su, Taoyuan (TW);
Jen-Feng Chen, Taichung (TW);
Hao-Chun Tung, Taoyuan (TW);
Yang-Zong Fan, Taoyuan (TW);
Chih-Ming Chang, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 17/582,090

(22) Filed: Jan. 24, 2022

(65) Prior Publication Data
US 2023/0151926 A1 May 18, 2023

(30) Foreign Application Priority Data

Nov. 15, 2021 (TW) .................................. 110142426

(51) Int. Cl.
| | |
|---|---|
| *F16M 13/00* | (2006.01) |
| *F16M 13/02* | (2006.01) |
| *F16M 11/12* | (2006.01) |
| *F16M 11/10* | (2006.01) |
| *H05K 5/00* | (2006.01) |

(52) U.S. Cl.
CPC .......... *F16M 13/022* (2013.01); *F16M 11/10* (2013.01); *F16M 11/126* (2013.01); *H05K 5/0017* (2013.01)

(58) Field of Classification Search
CPC .... F16M 13/022; F16M 11/10; F16M 11/126; H05K 5/0017
See application file for complete search history.

(56) References Cited

U.S. PATENT DOCUMENTS 4,703,909 A * 11/1987 Dayton ................... F21V 21/28
248/280.11
4,844,387 A * 7/1989 Sorgi ..................... F16M 13/00
108/5

(Continued)

FOREIGN PATENT DOCUMENTS

TW         M616224 U    9/2021

OTHER PUBLICATIONS

Office action of counterpart application by Taiwan IP Office dated Apr. 26, 2022.

*Primary Examiner* — Amy J. Sterling (57) ABSTRACT

A display device includes a screen, a screen support and a fixing module. The screen support is pivotally connected to the screen, and the screen support includes a first end and a second end. The fixing module is detachably connected to the screen support and includes a first sub-component and a second sub-component. The first sub-component has a first surface and a second surface, and the first sub-component is selectively connected to one of the first end and the second end. The second sub-component has a third surface and a fourth surface, and the second sub-component is configured for clamping a board. One of the first surface and the second surface of the first sub-component and one of the third surface and the fourth surface of the second sub-component are detachably connected.

11 Claims, 6 Drawing Sheets

(56) References Cited

U.S. PATENT DOCUMENTS

| | | | | | |
|---|---|---|---|---|---|
| 6,769,657 | B1 * | 8/2004 | Huang | ............... | F16M 13/022 |
| | | | | | 248/278.1 |
| 7,121,516 | B1 * | 10/2006 | Koh | .................. | F16M 13/022 |
| | | | | | 248/227.2 |
| 7,195,215 | B2 * | 3/2007 | Lin | ..................... | F16M 11/28 |
| | | | | | 248/125.9 |
| 7,246,780 | B2 * | 7/2007 | Oddsen, Jr. | ............ | F16M 13/02 |
| | | | | | 248/125.7 |
| 10,578,242 | B2 * | 3/2020 | Hung | .................. | F16M 11/20 |
| 2011/0315843 | A1 * | 12/2011 | Hung | ............... | F16M 13/022 |
| | | | | | 248/278.1 |
| 2022/0026012 | A1 * | 1/2022 | Huang | ............... | F16M 11/046 |
| 2023/0034925 | A1 * | 2/2023 | Wong | ................ | H05K 7/1417 |

\* cited by examiner

DISPLAY DEVICE AND FIXING MODULE

This application claims the benefit of Taiwan application Serial No. 110142426, filed Nov. 15, 2021, the subject matter of which is incorporated herein by reference.

TECHNICAL FIELD

The disclosure relates in general to a display device and fixing module.

BACKGROUND

The conventional display device includes a screen, a screen support, and a base. The screen support connects the screen and the base. In order to adjust an angle of the screen, the screen and the support are generally pivotally connected with respect to each other. The base is limited to lying on a flat surface (for example, a top surface of desktop). However, such a structure limits the display device to only be placed on a flat surface, which limits the application of the display device. Therefore, how to propose a new display device to improve the aforementioned problems is one of the directions of the industry in the art.

SUMMARY

According to an embodiment, a display device is provided. The display device includes a screen, a screen support and a fixed module. The screen support is connected to the screen and comprising a first end and a second end. The fixed module is detachably connected to the screen support and includes a first sub-component and a second sub-component. The first sub-component has a first surface and a second surface, wherein the first sub-component is selectively connected to one of the first end and the second end. The second sub-component has a third surface and a fourth surface, wherein the second sub-component is configured to clamp a board. Wherein one of the first surface and the second surface of the first sub-component and one of the third surface and the fourth surface of the second sub-component are detachably connected.

According to another embodiment, a fixing module is provided. The fixing module is detachably connected to a screen support, wherein the screen support comprises a first end and a second end. The fixing module includes a first sub-component and a second sub-component. The first sub-component has a first surface and a second surface, wherein the first sub-component is selectively connected to one of the first end and the second end. The second sub-component has a third surface and a fourth surface, wherein the second sub-component is configured to clamp a board. Wherein one of the first surface and the second surface of the first sub-component and one of the third surface and the fourth surface of the second sub-component are detachably connected.

The above and other aspects of the disclosure will become better understood with regard to the following detailed description of the preferred but non-limiting embodiment (s). The following description is made with reference to the accompanying drawings.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
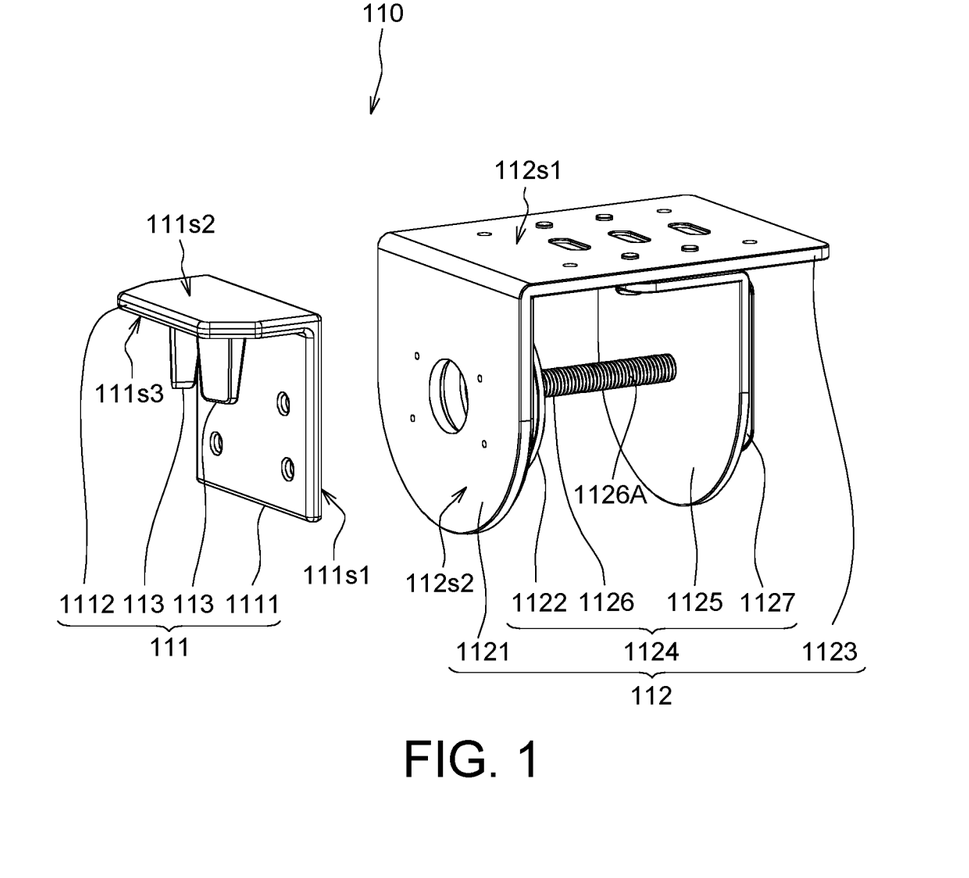
FIG. 1 shows a schematic diagram of a fixed module according to an embodiment of the present invention.
Figure 2:
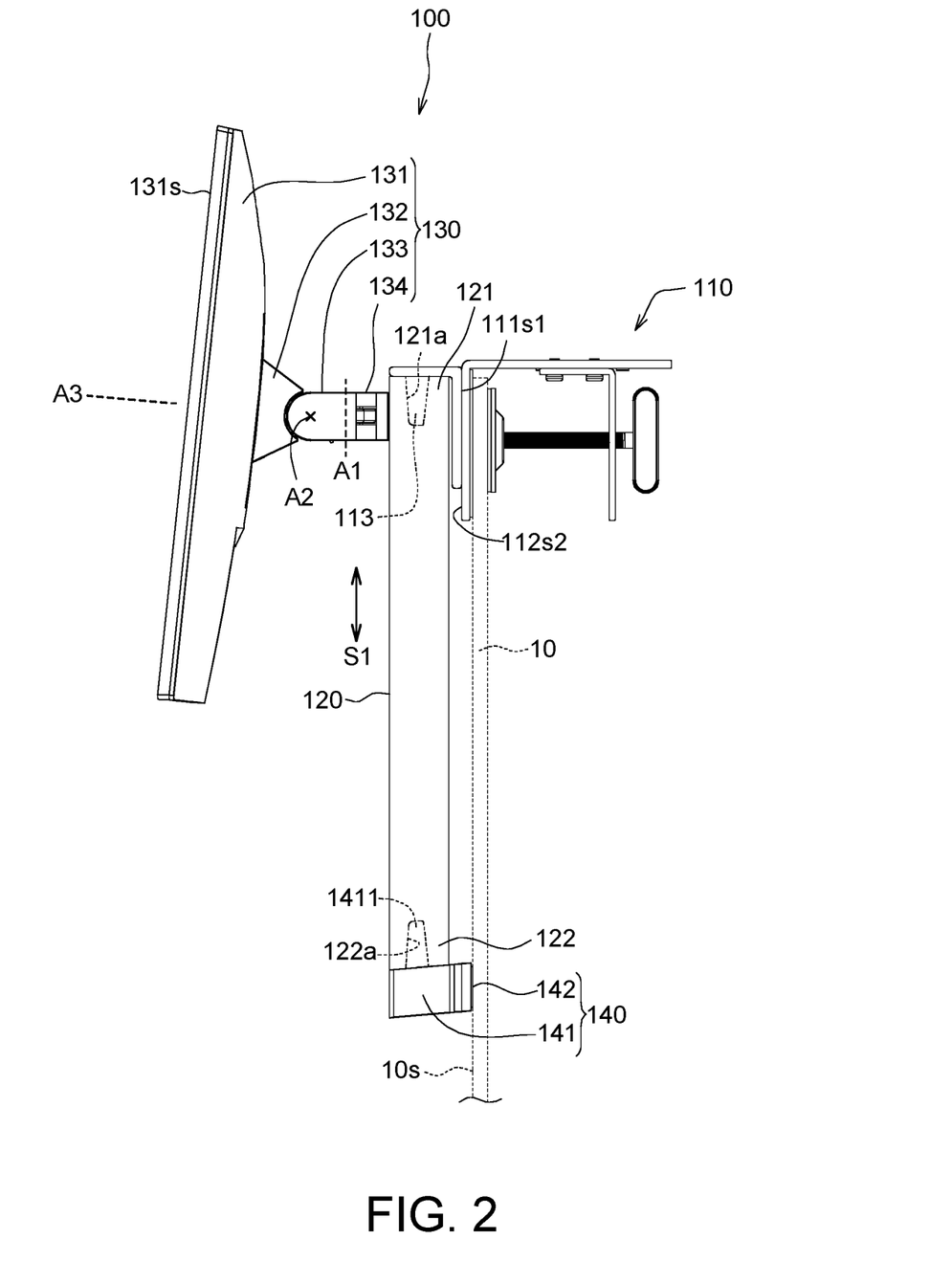
FIG. 2 shows a schematic diagram of a display device according to an embodiment of the present invention.
Figure 3:
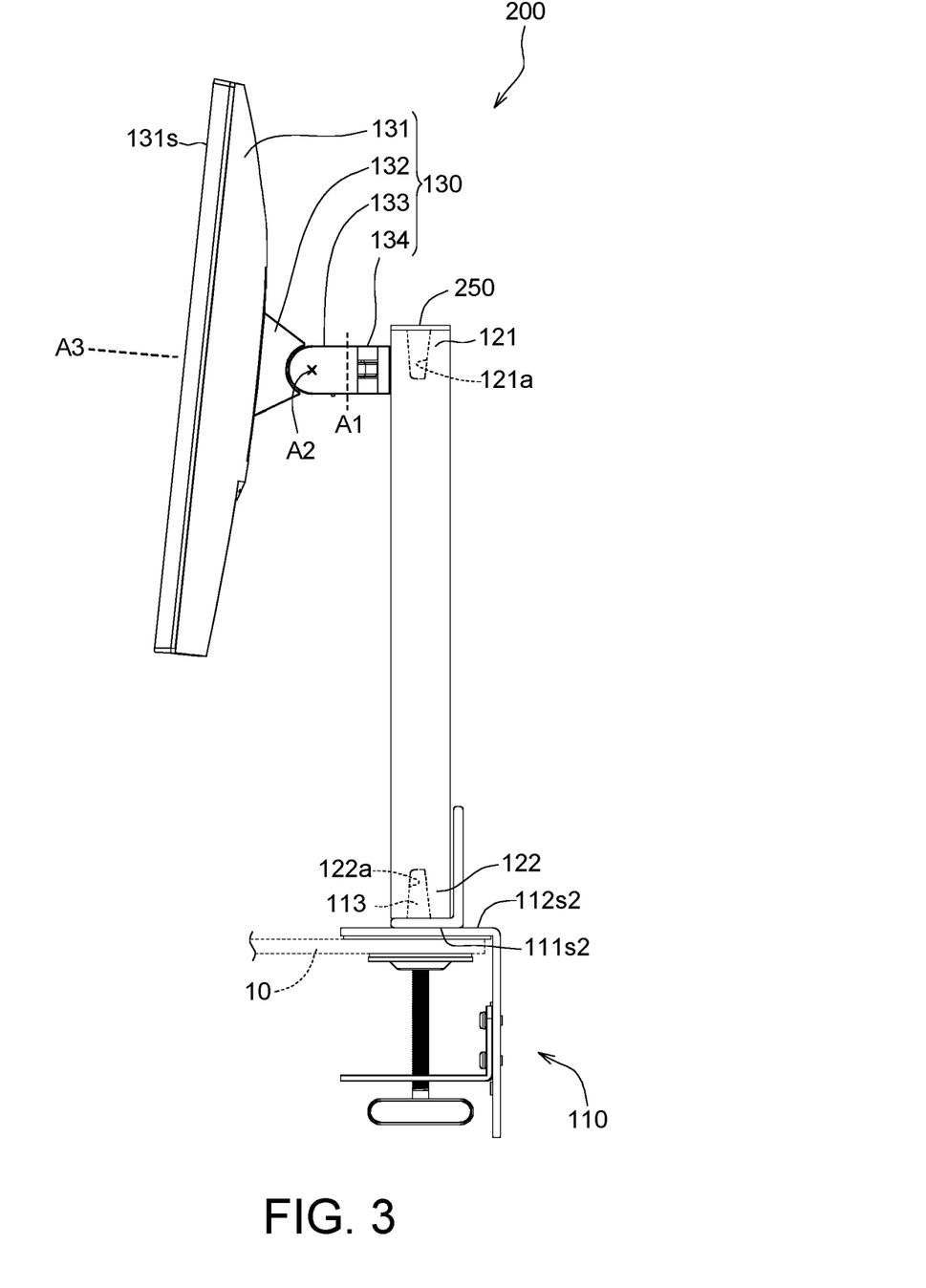
FIG. 3 shows a schematic diagram of a display device according to another embodiment of the present invention.
Figure 4:
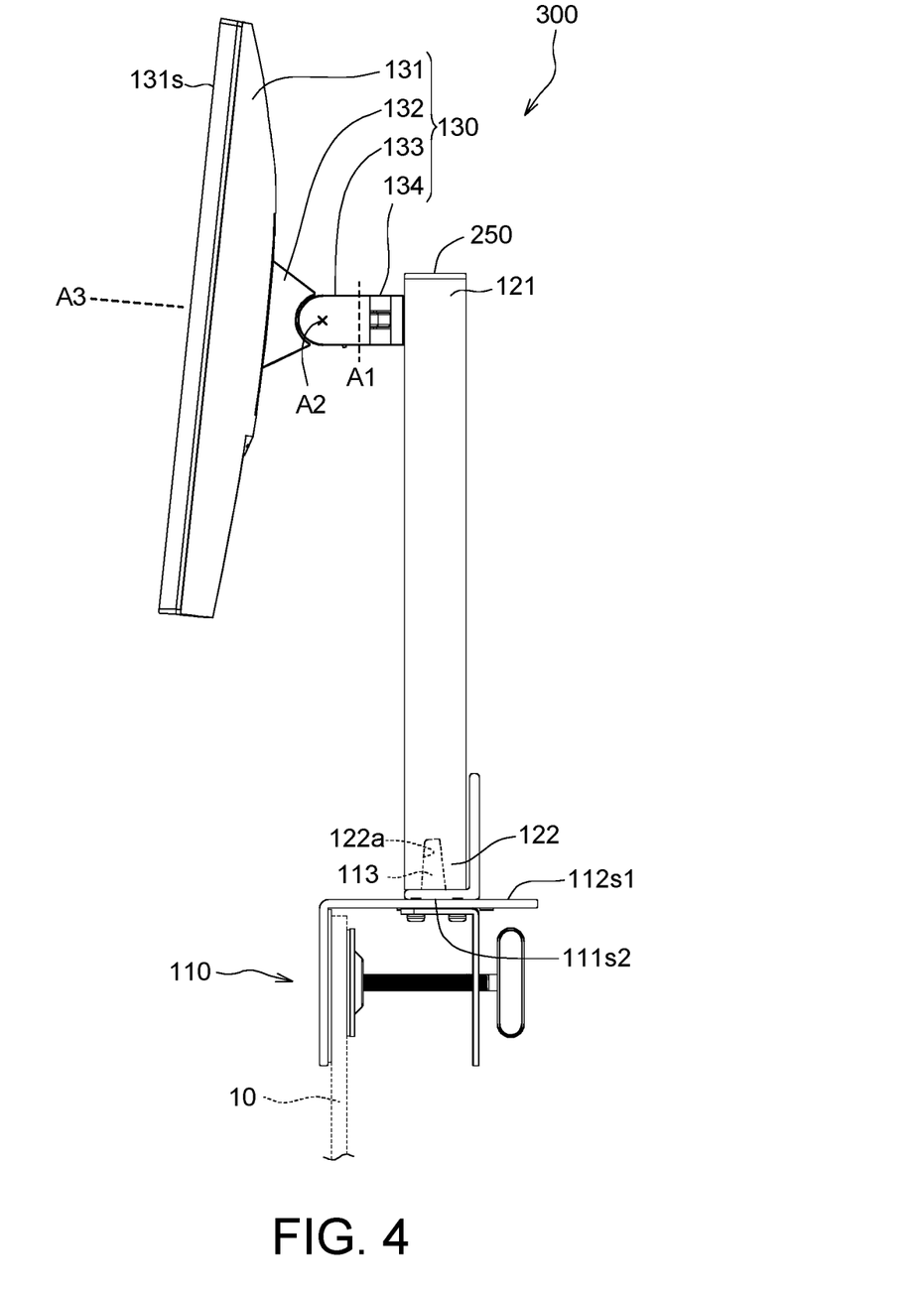
FIG. 4 shows a schematic diagram of a display device according to another embodiment of the present invention.
Figure 5:
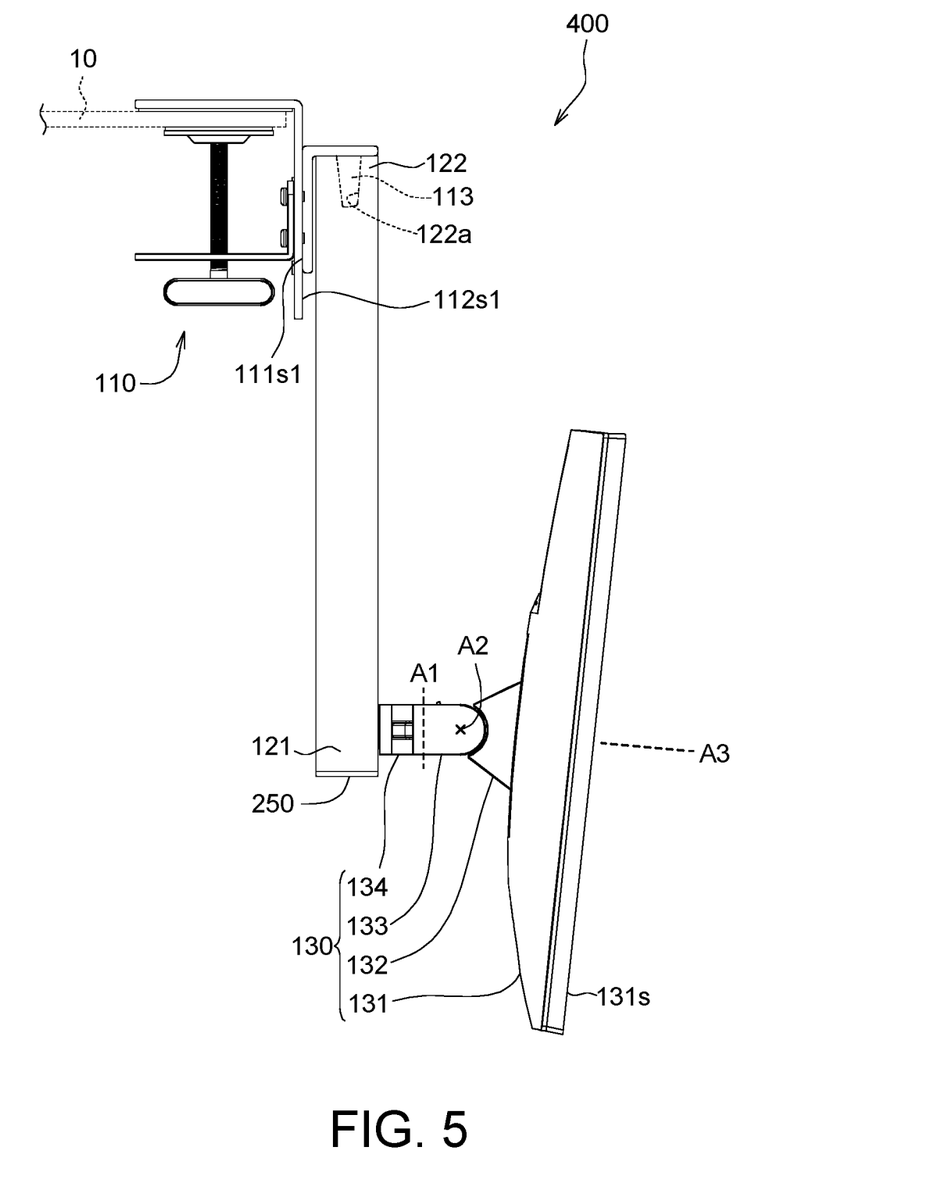
FIG. 5 shows a schematic diagram of a display device according to another embodiment of the present invention.

Referring to FIGS. 1 to 5. FIG. 1 shows a schematic diagram of a fixed module 110 according to an embodiment of the present invention, and FIG. 2 shows a schematic diagram of a display device 100 according to an embodiment of the present invention, FIG. 3 shows a schematic diagram of a display device 200 according to another embodiment of the present invention, FIG. 4 shows a schematic diagram of a display device 300 according to another embodiment of the present invention, and FIG. 5 shows a schematic diagram of a display device 400 according to another embodiment of the present invention.

As shown in FIG. 1, the fixed module 110 is detachably connected to the screen support 120. The screen support 120 includes a first end 121 (shown in FIG. 2) and a second end 122 (shown in FIG. 2). The fixing module 110 includes a first sub-component 111, a second sub-component 112 and at least one protruding post 113. The first sub-component 111 has a first surface $111s1$ and a second surface $111s2$, and the first sub-component 111 is selectively connected to one of the first end 121 and the second end 122. The second sub-component 112 has a third surface $112s1$ and a fourth surface $112s2$, and the second sub-component 112 is configured to clamp a board 10. One of the first surface $111s1$ and the second surface $111s2$ of the first sub-component 111 and one of the third surface $112s1$ and the fourth surface $112s2$ of the second sub-component 112 are detachably connected. As a result, the fixing module 110 is deformable, and the display device could be connected to the board 10 which horizontally extends or vertically extends in different postures through a variety of different connection ways of the first sub-component 111 and the second sub-component 112.

In addition, although not shown, the first sub-component 111 and the second sub-component 112 could be combined by temporary combining techniques such as screwing and snapping. For example, the fixing module 110 further includes at least one first combining portion (not shown) and at least one second combining portion (not shown) that could be matched with each other, and the first combining portion is disposed on the first surface $111s1$ and the second surface $111s2$ of the first sub-component 111, and the second combining portion is disposed on the third surface $112s1$ and the fourth surface $112s2$ of the second sub-component 112. Through the combination of the first combining portion and the second combining portion, the first sub-component 111 and the second sub-component 112 could be combined. In an embodiment, the first combining portion is, for example, one of the protrusion and the recess, and the second combining portion is, for example, the other of the protrusion and the recess. In another embodiment, one of the first combining portion and the second combining portion is, for example, a through hole, and the other is, for example, a screw hole, and at least one threaded element passes through the through hole and is screwed into the screw hole. The first sub-component 111 and the second sub-component 112 could also be combined.

As shown in FIG. 1, the first sub-component 111 includes a first plate 1111 and a second plate 1112. The first plate 1111 has the first surface 111s1. The second plate 1112 is substantially perpendicular to the first plate 1111 and the second plate 1112 has the second surface 111s2. The first surface 111s1 and the second surface 111s2 are substantially perpendicular to each other. The second plate 1112 has the fifth surface 111s3 opposite to the second surface 111s2, and the protruding post 113 is disposed on a fifth surface 111s3 of the second plate 1112 and protrudes relative to the fifth surface 111s3. The protruding post 113 could be inserted into the screen support 120 to fix the relative position of the fixing module 110 and the screen support 120.

As shown in FIG. 1, the second sub-component 112 includes a first clamping plate 1121, a second clamping plate 1122, a lateral plate 1123 and a pressing module 1124. The first clamping plate 1121 has the fourth surface 112s2. The second clamping plate 1122 and the first clamping plate 1121 are disposed opposite to each other. For example, the first clamping plate 1121 and the second clamping plate 1122 could be relatively movably disposed. The first clamping plate 1121 and the second clamping plate 1122 could clamp or release the board 10.

As shown in FIG. 1, the lateral plate 1123 has the third surface 112s1, and the third surface 112s1 is substantially perpendicular to the fourth surface 112s2. The lateral plate 1123 is connected to the first clamping plate 1121. The pressing module 1124 could include the aforementioned second clamping plate 1122, a fixing plate 1125, a connecting rod 1126 and an operating element 1127. The fixing plate 1125 is fixed to the lateral plate 1123.

The connecting rod 1126 passes through the fixing plate 1125 and is connected to the second clamping plate 1122. The fixing plate 1125 has female thread (not shown), the connecting rod 1126 has male thread 1126A, and the fixing plate 1125 and the connecting rod 1126 are screwed through the male thread 1126A and the female thread. Through screwing, the second clamping plate 1122 and the first clamping plate 1121 could clamp the board 10 between them.

As shown in FIG. 1, the connecting rod 1126 connects the second clamping plate 1122 with the operating element 1127, and the operating element 1127 is located outside the fixing plate 1125 for facilitating operation.

When the operating element 1127 rotates, the connecting rod 1126 accordingly rotates, such that the second clamping plate 1122 to move toward the first clamping plate 1121 until the second clamping plate 1122 and the first clamping plate 1121 tight clamp the board 10.

The following describes the relative relationship between the different deformations of the fixed module 110 and the screen support 120 and the screen 130.

First Embodiment

As shown in FIG. 2, the display device 100 includes the fixed module 110, the screen support 120 and the screen 130. The screen support 120 is pivotally connected to the screen 130, and the screen support 120 includes the first end 121 and the second end 122.

As shown in FIG. 2, the screen 130 includes a screen body (for example, a display panel) 131, a first pivoting element 132, a second pivoting element 133 and a third pivoting element 134. The screen body 131 could rotate relative to the screen support 120 around at least one rotating shaft (or axial direction). The third pivoting element 134 and the second pivoting element 133 are rotatably connected (swivel) relative to a first rotation axis (or axial direction) A1, and the first pivoting element 132 and the second pivoting element 133 are rotatably connected (tilt) relative to a second rotation axis A2. The screen body 131 and the first pivoting element 132 are rotatably connected (pivot) relative to a third rotation axis A3, wherein two of the first rotation axis A1, the second rotation axis A2 and the third rotation axis A3 are, for example, perpendicular to each other, and the third rotation axis A3 is, for example, parallel to a normal direction of a display surface 131s of the screen body 131. In addition, the third pivoting element 134 and the screen support 120 are relatively and slidably disposed in an extending direction S1 of the screen support 120. For example, the screen support 120 has at least one sliding slot (not shown), and the third pivoting element 134 has at least one sliding block (not shown), wherein the sliding block is pivotally connected to the sliding slot, so that the third pivoting element 134 and the screen support 120 could relatively slide.

In the present embodiment, the fixed module 110 is connected to the first end 121 of the screen support 120 when the fourth surface 112s2 of the second sub-component 112 of the fixed module 110 is connected with the first surface 111s1 of the first sub-component 111. The extending direction of the board 10 is substantially parallel to the extending direction of the display surface 131s of the screen 130 or a long axis of the screen support 120, and the screen 130 is located on a side of the board 10. The board 10 of the present embodiment is, for example, a partition board which vertically extends.

As shown in FIG. 2, the first end 121 and the second end 122 of the screen support 120 have a first recessed hole 121a and a second recessed hole 122a respectively. The first sub-component 111 is selectively inserted into one of the first recessed hole 121a and the second recessed hole 122a of the screen support 120 with the protruding post 113. The first recessed hole 121a and the second recessed hole 122a have similar or identical structures. In the present embodiment, the first sub-component 111 is inserted into the first recessed hole 121a of the first end 121 of the screen support 120 with the protruding post 113.

As shown in FIG. 2, the display device 100 further includes a fixing element 140. The fixing element 140 includes a main body 141 and a fixing portion 142, wherein the fixing portion 142 is disposed on the main body 141, and the main body 141 could include at least one protruding post 1411, and the protruding post 1411 could be temporarily engaged with the second recessed hole 122a of the screen support 120 to fix the relative position between the fixing element 140 and the screen support 120. In addition, one of the fixing portion 142 and a magnetic member disposed on the surface 10s is, for example, a magnet, and the other is, for example, a magnet or a magnetic member that could generate an induced magnetic field with the magnet, such that the fixing element 140 having magnetic force and the magnetic member disposed on the surface 10s of the board 10 could be combined with each other. In addition, the protruding post 1411 has the same or similar structure as that of the protruding post 113.

Second Embodiment

As shown in FIG. 3, the display device 200 includes the fixed module 110, the screen support 120 and the screen 130. The fixed module 110 is connected to the second end 122 of the screen support 120 when the second surface 111s2 of the first sub-component 111 of the fixed module 110 is connected with the fourth surface 112s2 of the second sub-component 112. The extending direction of the board 10 is substantially perpendicular to the extending direction of the display surface 131s of the screen 130 or the long axis of the screen support 120. The board 10 of the present embodiment is, for example, a table plate which horizontally extends. The screen 130 is located above the board 10. In the present embodiment, the first sub-component 111 is inserted into the second recessed hole 122a of the second end 122 of the screen support 120 with the protruding post 113.

In addition, the display device 200 further includes a shield 250. The shield 250 could cover an end surface of the first end 121 of the screen support 120 to cover the first recessed hole 120a. The shield 250 could have magnetic or include a magnetic member or magnet, so that the first end 121 (having a magnetic member or magnet) of the screen support 120 and the shield 250 could be temporarily combined with magnetic attraction.

Third Embodiment

As shown in FIG. 4, the display device 300 includes the fixed module 110, the screen support 120, the screen 130 and the shield 250. The fixed module 110 is connected to the second end 122 of the screen support 120 when the second surface 111s2 of the first sub-component 111 of the fixed module 110 is connected with the third surface 112s1 of the second sub-component 112. The extending direction of the board 10 is substantially parallel to the extending direction of the display surface 131s of the screen 130 or the long axis of the screen support 120, and the screen 130 is located above the board 10. The board 10 of the present embodiment is, for example, a partition board which vertically extends. In the present embodiment, the first sub-component 111 is inserted into the second recessed hole 122a of the second end 122 of the screen support 120 with the protruding post 113.

Compared with the board 10 in the first embodiment, a top position of the board 10 in the third embodiment is lower (shorter), and the present embodiment could be configured to increase the height of the screen 130.

Fourth Embodiment

As shown in FIG. 5, the display device 400 includes the fixed module 110, the screen support 120, the screen 130 and the shield 250. The fixed module 110 is connected to the second end 122 of the screen support 120 when the first surface 111s1 of the first sub-component 111 of the fixed module 110 is connected with the third surface 112s1 of the second sub-component 112. The extending direction of the board 10 is substantially perpendicular to the display surface 131 s of the screen 130, and the screen 130 is located below the board 10. The board 10 of the present embodiment is, for example, a ceiling which extends horizontally, and the display device 400 could be hung on the ceiling upside down. In the present embodiment, the first sub-component 111 is inserted into the second recessed hole 122a of the second end 122 of the screen support 120 with the protruding post 113.

Figure 6:
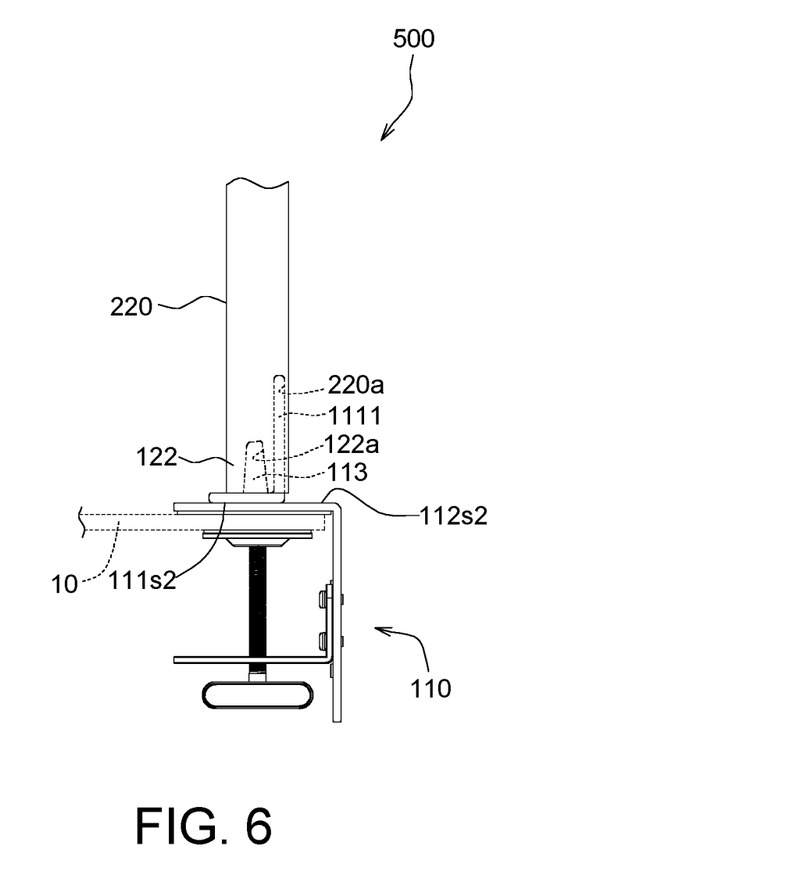
FIG. 6 shows a schematic diagram of a display device according to an embodiment of the present invention.

Referring to FIG. 6, FIG. 6 shows a schematic diagram of a display device 500 according to an embodiment of the present invention. The display device 500 includes the fixed module 110, the screen support 220, the screen 130 (not shown) and the shield 250 (not shown). The fixed module 110 is connected to the second end 122 of the screen support 220 when the second surface 111s2 of the first sub-component 111 of the fixed module 110 is connected with the fourth surface 112s2 of the second sub-component 112. The display device 500 of the embodiment of the present invention has the structural features same as or similar to that of the display device 200 expect that the screen support 220 has an accommodating groove 220a, and the accommodating groove 220a could receive a portion of the first sub-component 1111, for example, at least one portion of the first plate 1111 of the display device 500. As a result, it could prevent the first plate 1111 from being exposed and interfering with physical components in the environment.

In summary, the embodiment of the present invention provides a fixed module and a display device using the same, the same (or one) fixed module could change the relative relationship among the fixed module, the screen support and the screen by changing the connection way of its two sub-components to make the display device be suitable for the board which vertically extends or horizontally extends. According to the structure of the fixed module of the embodiment of the present invention, the fixed module could generate at least four deformed postures.

It will be apparent to those skilled in the art that various modifications and variations could be made to the disclosed embodiments. It is intended that the specification and examples be considered as exemplary only, with a true scope of the disclosure being indicated by the following claims and their equivalents.

What is claimed is:

1. A display device, comprising:
   a screen;
   a screen support connected to the screen and comprising a first end and a second end; and
   a fixed module detachably connected to the screen support and comprising:
   a first sub-component comprising a first plate and a second plate vertically connected with the first plate, wherein the first plate has a first surface, the second plate has a second surface and a fifth surface opposite to the second surface, and the fifth surface of the first sub-component is selectively connected to one of the first end and the second end; and
   a second sub-component comprising a first clamping plate and a lateral plate vertically connected with the first clamping plate, wherein the first clamping plate has a fourth surface, the lateral plate has a third surface, and the second sub-component is configured to clamp a board;
   wherein one of the first surface and the second surface of the first sub-component and one of the third surface and the fourth surface of the second sub-component are detachably connected;
   wherein when the fourth surface is connected to the first surface, the fixing module is connected to the first end of the screen support; an extending direction of the board is substantially parallel to a display surface of the screen, and the screen is located at a side of the board.

2. The display device according to claim 1, Wherein the first end and the second end of the screen support respectively have a first recessed hole and a second recessed hole, and the fixing module further comprising:
a protruding post disposed on the first sub-component;
wherein the first sub-component is selectively inserted into one of the first recessed hole and the second recessed hole of the screen support by the protruding post.

3. The display device according to claim 1, wherein the second sub-component comprises:
a second clamping plate disposed opposite to the first clamping plate;
wherein the first clamping plate and the second clamping plate are configured to clamp the board.

4. The display device according to claim 3, wherein the second sub-component comprises:
a pressing module, comprising:
the second clamping plate;
a fixing plate fixed to the lateral plate; and
a connecting rod passing through the fixing plate and connected to the second clamping plate.

5. The display device according to claim 4, wherein the fixing plate has female thread, the connecting rod has male thread, and the fixing plate and the connecting rod are screwed through the female thread and the male thread.

6. The display device according to claim 1, wherein the fixing module further comprises:
a protruding post disposed on the fifth surface of the second plate;
wherein the protruding post is inserted into the screen support.

7. The display device according to claim 1, wherein when the second surface is connected to the fourth surface, the fixing module is connected to the second end of the screen support; an extending direction of the board is substantially perpendicular to a display surface of the screen.

8. The display device according to claim 1, wherein when the second surface is connected to the third surface, the fixing module is connected to the second end of the screen support; an extending direction of the board is substantially parallel to a display surface of the screen, and the screen is located at above the board.

9. The display device according to claim 1, wherein when the first surface and the third surface are connected, the fixing module is connected to the second end of the screen support; an extending direction of the board is substantially perpendicular to a display surface of the screen, and the screen is located below the board.

10. The display device according to claim 1, wherein the screen support has an accommodating groove for receiving a portion of the first sub-component.

11. A display device, comprising:
a screen;
a screen support connected to the screen and comprising a first end and a second end; and
a fixed module detachably connected to the screen support and comprising:
a first sub-component comprising a first plate and a second plate vertically connected with the first plate, wherein the first plate has a first surface, the second plate has a second surface and a fifth surface opposite to the second surface, and the fifth surface of the first sub-component is selectively connected to one of the first end and the second end; and
a second sub-component comprising a first clamping plate and a lateral plate vertically connected with the first clamping plate, wherein the first clamping plate has a fourth surface, the lateral plate has a third surface, and the second sub-component is configured to clamp a board;
wherein one of the first surface and the second surface of the first sub-component and one of the third surface and the fourth surface of the second sub-component are detachably connected;
wherein when the second surface is connected to the third surface, the fixing module is connected to the second end of the screen support; an extending direction of the board is substantially parallel to a display surface of the screen, and the screen is located at above the board.

* * * * *